(12) United States Patent
Lu et al.

(10) Patent No.: US 12,739,095 B2
(45) Date of Patent: Sep. 15, 2026

(54) PATTERN TRANSITION FILTER FOR CLOCK DATA RECOVERY

(71) Applicant: QUALCOMM Incorporated, San Diego, CA (US)

(72) Inventors: Lejie Lu, San Diego, CA (US); Hao Liu, San Diego, CA (US); Yu Song, San Diego, CA (US)

(73) Assignee: QUALCOMM Incorproated, San Diego, CA (US)

( * ) Notice: Subject to any disclaimer, the term of this patent is extended or adjusted under 35 U.S.C. 154(b) by 19 days.

(21) Appl. No.: 19/013,384

(22) Filed: Jan. 8, 2025

(65) Prior Publication Data

US 2026/0197153 A1 Jul. 9, 2026

(51) Int. Cl.
*H04L 7/033* (2006.01)
*H03L 7/08* (2006.01)
*H03L 7/085* (2006.01)

(52) U.S. Cl.
CPC .......... *H04L 7/0337* (2013.01); *H03L 7/0807* (2013.01); *H03L 7/085* (2013.01)

(58) Field of Classification Search
CPC ...... H04L 7/0337; H03L 7/0807; H03L 7/085
USPC .......................................................... 375/355
See application file for complete search history.

(56) References Cited

U.S. PATENT DOCUMENTS 11,615,862 B2 * 3/2023 Balb .................... G11C 29/023 365/185.09
12,028,077 B1 7/2024 Liu et al.
2005/0259772 A1 * 11/2005 Voutilainen ......... H04L 25/4917 375/353
2023/0026005 A1 * 1/2023 Kim ......................... H04B 1/04

OTHER PUBLICATIONS

International Search Report and Written Opinion—PCT/US2025/059839—ISA/EPO—Apr. 21, 2026.

Kwon D-H., et al., "A 32-Gb/s PAM-4 Quarter-Rate Clock and Data Recovery Circuit With an Input Slew-Rate Tolerant Selective Transition Detector", IEEE, Transactions on Circuits and Systems II: Express Briefs IEEE, USA, vol. 66, No. 3, Mar. 1, 2019, pp. 362-366, XP011712385, ISSN: 1549-7747, Abstract p. 1, col. 1—p. 2, col. 2.

(Continued)

*Primary Examiner* — Leila Malek
(74) *Attorney, Agent, or Firm* — Loza & Loza, LLP

(57) ABSTRACT

A method for transition filtering includes receiving a data signal including a first data symbol and a second data symbol, wherein each of the first data symbol and the second data symbol is at one of a first level, a second level, and a third level, sampling the first data symbol at a first sampling time to generate a first data bit and a second data bit, sampling the data signal at a second sampling time to generate an edge bit, sampling the second data symbol at a third sampling time to generate a third data bit and a fourth data bit, detecting a transition between the first level and the third level between the first data symbol and the second data symbol, and passing the first data bit, the third data bit, and the edge bit to a phase detector in response to detecting the transition.

20 Claims, 14 Drawing Sheets

(56) References Cited

OTHER PUBLICATIONS

Lv F., et al., "Design of 56 Gb/s PAM4 Wire-line Receiver with Ring VCO Based CDR in a 65 nm CMOS Technology", IEEE, 12th International Conference on Asic (ASICON) IEEE, Oct. 25, 2017, pp. 537-540, XP033294982, Abstract p. 537, col. 1—col. 2 p. 538, col. 2 p. 539, col. 1—col. 2.

Zhang Z., et al., "A 32-Gb/s 0.46-pJ/bit PAM4 CDR Using a Quarter-Rate Linear Phase Detector and a Self-Biased PLL-Based Multiphase Clock Generator", IEEE, Journal of Solid-state Circuits IEEE, USA, vol. 55, No. 10, Jul. 10, 2020, pp. 2734-2746, XP011811050, ISSN: 0018-9200, Abstract p. 16, col. 1.

* cited by examiner

PATTERN TRANSITION FILTER FOR CLOCK DATA RECOVERY

BACKGROUND

Field

Aspects of the present disclosure relate generally to clock data recovery (CDR), and more particularly, to a pattern transition filter for CDR.

Background

In a system, data may be transmitted from a transmitter to a receiver across a channel (i.e., link). The data may be transmitted using data symbols where each data symbol carries one or more bits. For example, the system may transmit the data using pulse amplitude modulation (PAM) in which the amplitude of each data symbol represents one or more bits of data. One or more clock signals for sampling the data symbols at the receiver may be generated by a clock data recovery (CDR) circuit.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a sampling circuit, wherein the sampling circuit is configured to receive a data signal including a first data symbol and a second data symbol, wherein each of the first data symbol and the second data symbol is at one of a first level, a second level, and a third level, sample the first data symbol at a first sampling time to generate a first data bit and a second data bit, sample the data signal at a second sampling time to generate an edge bit, and sample the second data symbol at a third sampling time to generate a third data bit and a fourth data bit. The system also includes a phase detector and a transition filter coupled between the sampling circuit and the phase detector. The transition filter is configured to receive the first data bit, the third data bit, and the edge bit, detect a transition between the first level and the third level between the first data symbol and the second data symbol, and pass the first data bit, the third data bit, and the edge bit to the phase detector if the transition between the first level and the third level is detected.

A second aspect relates to a system. The system includes a sampling circuit, wherein the sampling circuit is configured to receive a data signal including a first data symbol and a second data symbol, wherein each of the first data symbol and the second data symbol is at one of a first level, a second level, and a third level, sample the first data symbol at a first sampling time to generate a first data bit and a second data bit, sample the data signal at a second sampling time to generate an edge bit, and sample the second data symbol at a third sampling time to generate a third data bit and a fourth data bit. The system also includes a phase detector and a transition filter coupled between the sampling circuit and the phase detector. The transition filter includes a first gating circuit configured to receive the first data bit, a second gating circuit configured to receive the third data bit, and a third gating circuit configured to receive the edge bit. The transition filter also includes a transition detector configured to receive the first data bit, the second data bit, the third data bit, and the fourth data bit and cause the first gating circuit, the second gating circuit, and the third gating circuit to pass the first data bit, the third data bit, and the edge bit, respectively, to the phase detector if the first data bit and the third data bit have different bit values and the second data bit and the fourth data bit have different bit values.

A third aspect relates to a method for transition filtering. The method includes receiving a data signal including a first data symbol and a second data symbol, wherein each of the first data symbol and the second data symbol is at one of a first level, a second level, and a third level. The method also includes sampling the first data symbol at a first sampling time to generate a first data bit and a second data bit, sampling the data signal at a second sampling time to generate an edge bit, and sampling the second data symbol at a third sampling time to generate a third data bit and a fourth data bit. The method also includes detecting a transition between the first level and the third level between the first data symbol and the second data symbol, and passing the first data bit, the third data bit, and the edge bit to a phase detector in response to detecting the transition between the first level and the third level.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
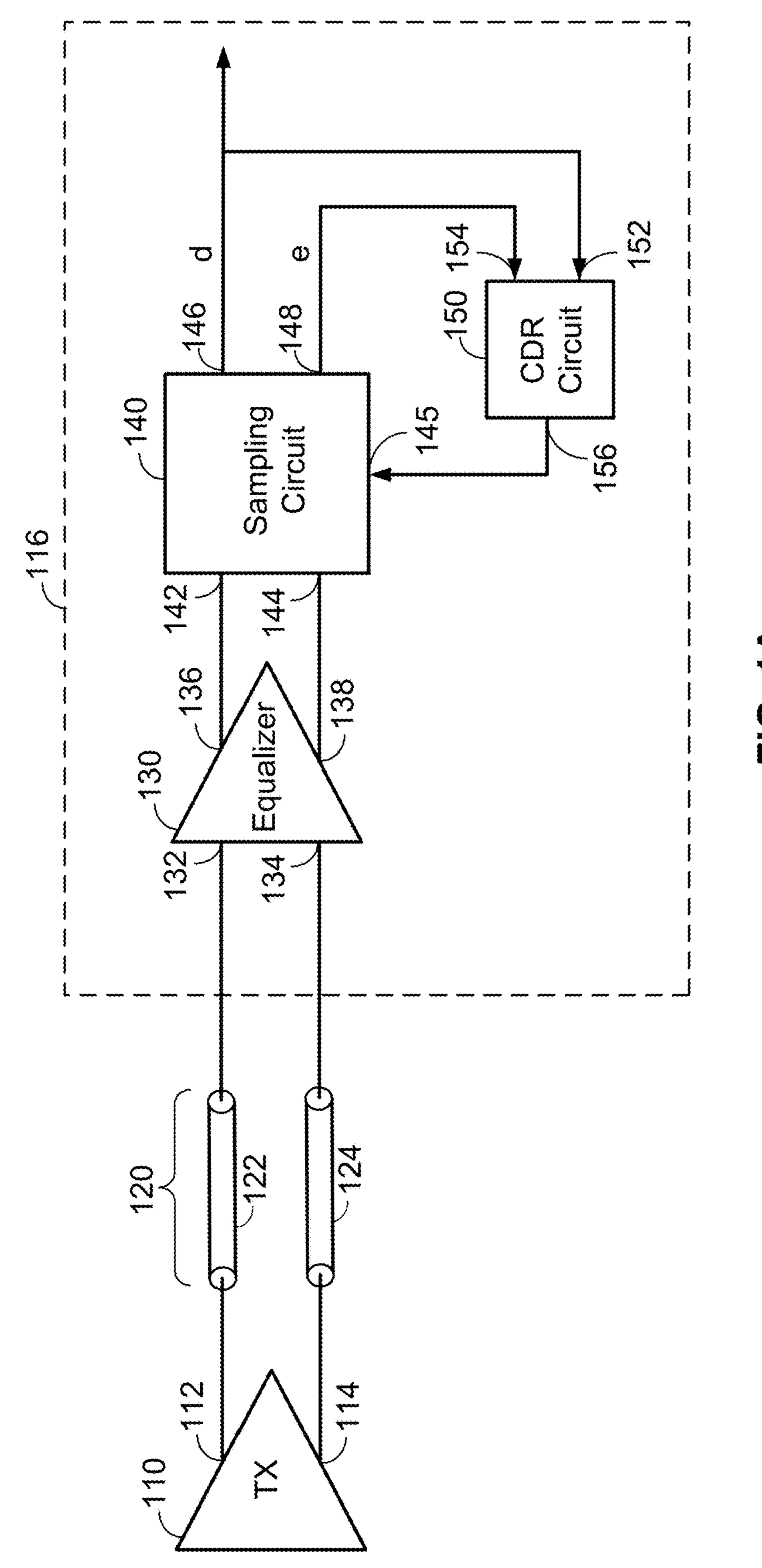
FIG. 1A shows an example of a system including a clock data recovery (CDR) circuit according to certain aspects of the present disclosure.

FIG. 1A shows an example of a system 100 in which data is transmitted from a transmitter 110 to a receiver 116 across a channel 120 (e.g., a serial link) coupled between the transmitter 110 and the receiver 116. In this example, the channel 120 is a differential channel (e.g., a differential serial link) including a first transmission line 122 and a second transmission line 124 configured to carry a differential data signal. However, it is to be appreciated that the present disclosure is not limited to this example.

In this example, the transmitter 110 receives data bits from a data source (not shown), converts the data bits into a sequence of data symbols, and transmits the data symbols in a differential data signal across the channel 120. In the example in FIG. 1A, the transmitter 110 has a differential output including a first output 112 and a second output 114, and transmits each data symbol via the differential output using differential signaling. In this example, the voltage level (i.e., amplitude) of each data symbol may correspond to the voltage between the first output 112 and the second output 114. As discussed further below, the transmitter 110 may convert the data bits into the data symbols using non-return-to-zero (NRZ) modulation, pulse amplitude modulation 3-level (PAM3), PAM4, or another modulation scheme.

The receiver 116 receives the data signal including the data symbols from the channel 120 and converts the received data symbols into bits. In the example in FIG. 1A, the receiver 116 includes an equalizer 130, a sampling circuit 140, and a clock data recovery (CDR) circuit 150 according to certain aspects. It is to be appreciated that the receiver 116 may include one or more additional circuits not shown in FIG. 1A such as an impedance matching network.

In this example, the equalizer 130 has a differential input including a first input 132 coupled to the first transmission line 122 and a second input 134 coupled to the second transmission line 124. The equalizer 130 may also have a differential output including a first output 136 and a second output 138. In this example, the equalizer 130 is configured to equalize the received data signal to compensate for high frequency attenuation in the channel 120. For example, the equalizer 130 may include a continuous time linear equalizer (CTLE) with gain peaking at high frequency to compensate for high frequency attenuation in the channel 120. It is to be appreciated that the equalizer 130 may be omitted in some implementations.

In the example in FIG. 1A, the sampling circuit 140 has a differential input including a first input 142 coupled to the first output 136 of the equalizer 130 and a second input 144 coupled to the second output 138 of the equalizer 130. The sampling circuit 140 also has a clock input 145 configured to receive one or more clock signals.

The sampling circuit 140 is configured to perform data sampling on the data signal using the one or more clock signals to sample the data symbols in the data signal, convert the sampled data symbols into data bits (labeled "d"), and output the data bits via a first output 146. The sampling circuit 140 is also configured to perform edge sampling on the data signal using the one or more clock signals to generate edge bits (labeled "e") and output the edge bit via a second output 148. As discussed further below, the edge sampling is phase offset from the data sampling. The sampling circuit 140 may use a full clock rate architecture, a half clock rate architecture, or the like, as discussed further below.

The CDR circuit 150 has a first input 152, a second input 154, and an output 156. The first input 152 is coupled to the first output 146 of the sampling circuit 140 to receive the data bits, the second input 154 is coupled to the second output 148 of the sampling circuit 140 to receive the edge bits, and the output 156 is coupled to the clock input 145 of the sampling circuit 140. The CDR circuit 150 is configured to generate the one or more clock signals based on the data bits and the edge bits and output the one or more clock signals to the clock input 145 of the sampling circuit 140. Exemplary implementations of the CDR circuit 150 according to certain aspects are discussed below.

Figure 1B:
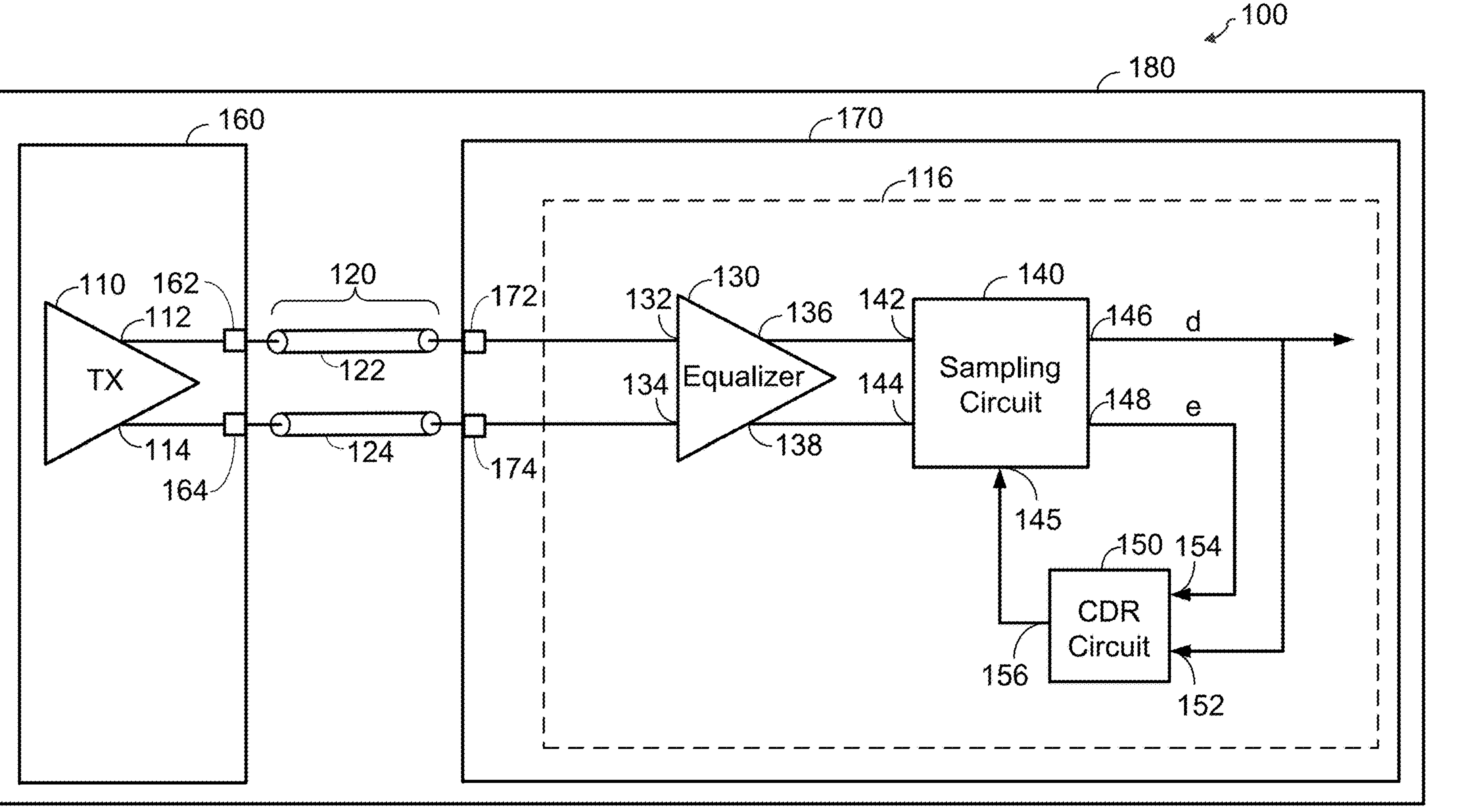
FIG. 1B shows an example in which the system of FIG. 1A is used to facilitate chip-to-chip communication according to certain aspects of the present disclosure.

In certain aspects, the system 100 may be used to facilitate chip-to-chip communication, including chiplet-to-chiplet communication. In this regard, FIG. 1B shows an example in which the system facilitates chip-to-chip communication between a first chip 160 and a second chip 170. In the example in FIG. 1B, the transmitter 110 is integrated on the first chip 160, the receiver 116 is integrated on the second chip 170, and the channel 120 (e.g., differential serial link) is coupled between the first chip 160 and the second chip 170. In certain aspects, the first chip 160 and the second chip 170 may be mounted on a substrate 180 (e.g., printed circuit board (PCB)). In these aspects, the channel 120 may be implemented with metal traces on and/or embedded in the substrate 180. However, it is to be appreciated that the present disclosure is not limited to this example.

In this example, the first chip 160 includes a first pad 162 coupled to the first output 112 of the transmitter 110 and a second pad 164 coupled to the second output 114 of the transmitter 110. The second chip 170 includes a first pad 172 coupled to the first input 132 of the equalizer 130 and a second pad 174 coupled to the second input 134 of the equalizer 130. In this example, the first transmission line 122 of the channel 120 is coupled between the first pad 162 of the first chip 160 and the first pad 172 of the second chip 170, and the second transmission line 124 of the channel 120 is coupled between the second pad 164 of the first chip 160 and the second pad 174 of the second chip 170.

Figure 2:
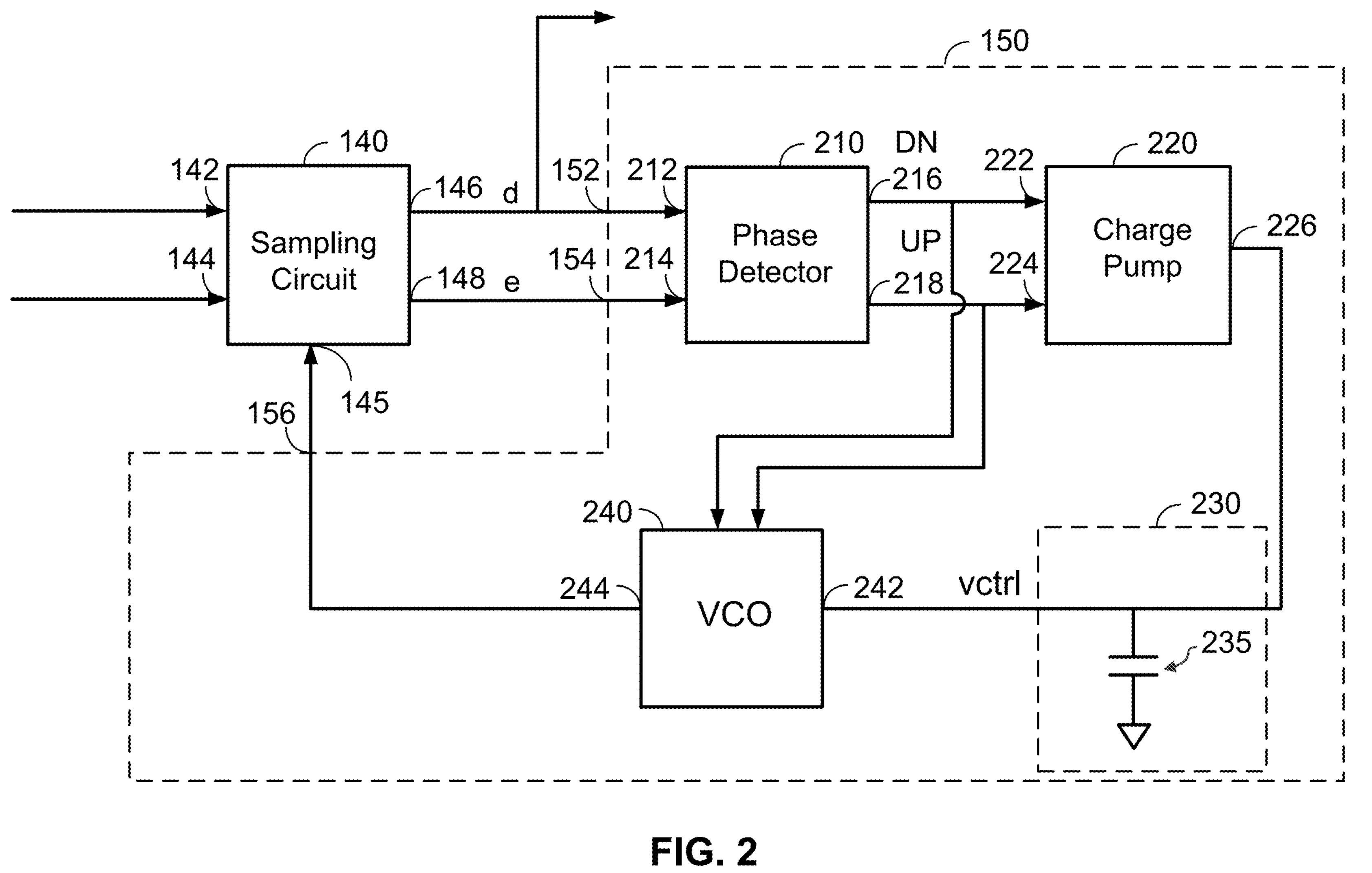
FIG. 2 shows an exemplary implementation of the clock data recovery (CDR) circuit according to certain aspects of the present disclosure.

FIG. 2 shows an exemplary implementation of the CDR circuit 150 according to certain aspects. In this example, the CDR circuit 150 includes a phase detector 210, a charge pump 220, a loop filter 230, and a voltage controlled oscillator (VCO) 240.

The phase detector 210 has a first input 212, a second input 214, a first output 216, and a second output 218. The first input 212 is coupled to the first output 146 of the sampling circuit 140 to receive the data bits (labeled "d") and the second input 214 is coupled to the second output 148 of the sampling circuit 140 to receive the edge bits (labeled "e"). The phase detector 210 is configured to generate a down (DN) signal or an up (UP) signal based on the received data bits and edge bits. The phase detector 210 is configured to output the DN signal at the first output 216 and output the UP signal at the second output 218, or vice versa. The phase detector 210 may be implemented with a bang-bang phase detector or another type of phase detector.

The charge pump 220 has a first input 222 coupled to the first output 216 of the phase detector 210, a second input 224 coupled to the second output 218 of the phase detector 210, and an output 226 coupled to the loop filter 230. The charge pump 220 may be configured to source a charging current to the loop filter 230 when the phase detector 210 outputs the UP signal and sink a discharging current from the loop filter 230 when the phase detector 210 outputs the DN signal.

The loop filter 230 is coupled between the output 226 of the charge pump 220 and an input 242 of the VCO 240. The loop filter 230 is configured to generate a control voltage vctrl based on the charging/discharging currents of the charge pump 220. For example, the loop filter 230 may include a capacitor 235 that integrates the charging/discharging currents to generate the control voltage vctrl. However, it is to be appreciated that the loop filter 230 is not limited to this example.

The VCO 240 is configured to generate the one or more clock signals used for data sampling and edge sampling. The VCO 240 is also configured to receive the control voltage vctrl at the input 242 and tune the frequency of the one or more clock signals based on the control voltage vctrl. The VCO 240 outputs the one or more clock signals to the sampling circuit 140 via an output 244 coupled to the clock input 145 of the sampling circuit 140. In certain aspects, the VCO 240 may be implemented with a multiphase VCO configured to output multiple clock signals having the same frequency (e.g., the VCO frequency) and different phases. In this example, the output 244 of the VCO 240 may include multiple parallel outputs and the clock input 145 of the sampling circuit 140 may include multiple parallel inputs.

The VCO 240 may be implemented with an inductor-capacitor (LC) oscillator in which the capacitance of the LC oscillator is tuned by the control voltage vctrl. In other implementations, the VCO 240 may be implemented with a current-starved ring oscillator in which the current supplied to the current-starved ring oscillator is tuned based on the control voltage vctrl. However, it is to be appreciated that the VCO 240 is not limited to these examples. In some implementations, the VCO 240 has positive voltage control in which the VCO frequency increases as the control voltage vertl increases. In other implementations, the VCO 240 has negative voltage control in which the VCO frequency increases as the control voltage vctrl decreases.

During operation, the loop of the CDR circuit 150 tunes the frequency of the VCO 240 based on the data bits and the edge bits such that the data sampling is approximately centrally aligned between transitions in the incoming data symbols and edge sampling is approximately aligned with the transitions in the incoming data symbols. This helps ensure that the data symbols are properly sampled by the sampling circuit 140 to generate the data bits.

It is to be appreciated that the CDR circuit 150 may include one or more additional loops not shown in FIG. 2. For example, FIG. 2 shows an example in which the CDR circuit 150 also includes a proportional control path coupled between the outputs 216 and 218 of the phase detector 210 and the VCO 240.

Figure 3A:
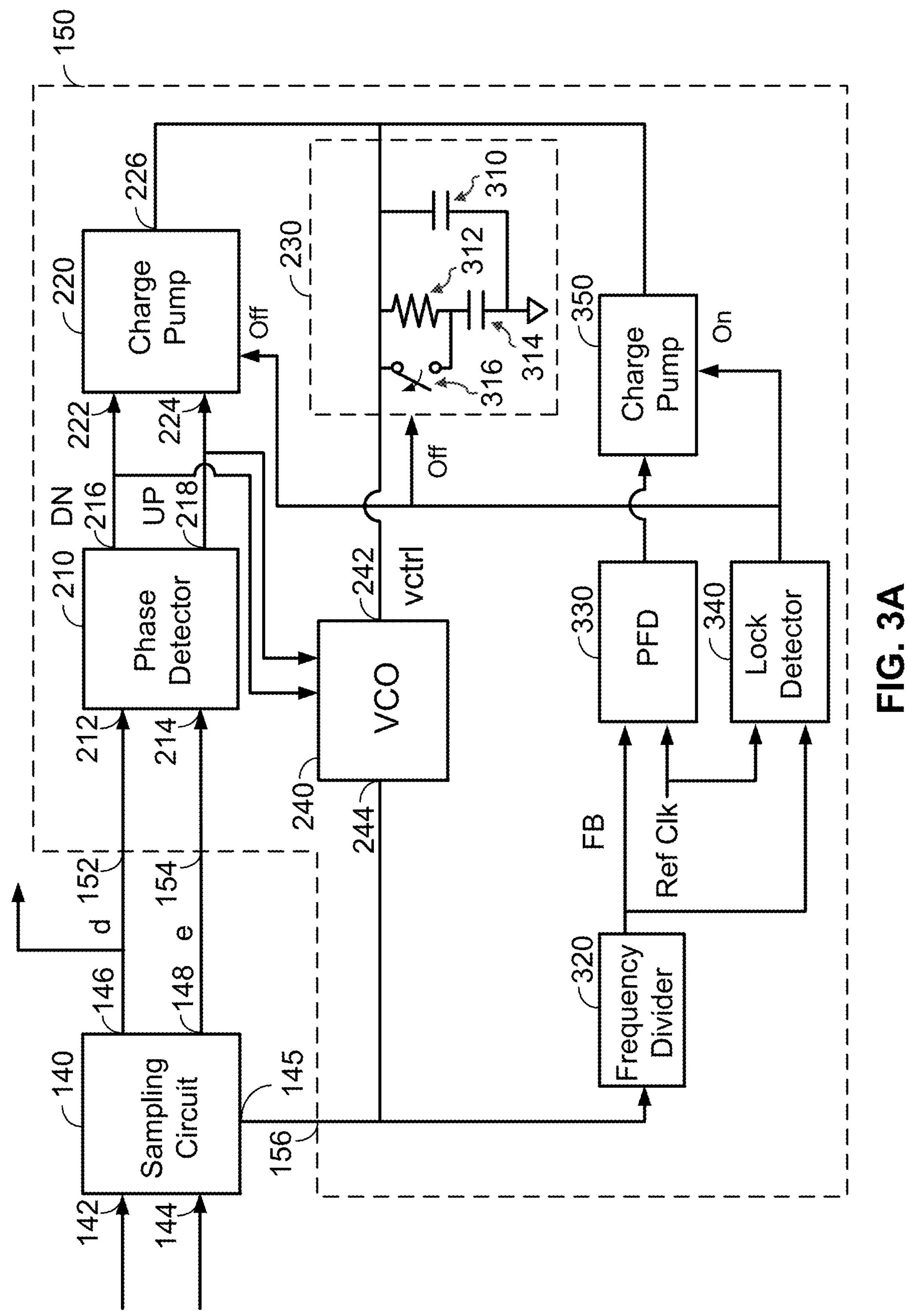
FIG. 3A shows an example in which the CDR circuit of FIG. 2 includes an additional loop for setting a frequency of a voltage controlled oscillator (VCO) according to certain aspects of the present disclosure.

FIG. 3A shows an example in which the CDR circuit 150 includes a second loop to set the initial frequency of the VCO 240. The second loop includes a frequency divider 320, a phase frequency detector (PFD) 330, a second charge pump 350, the loop filter 230, and the VCO 240. In this example, the loop filter 230 and the VCO 240 are shared by both loops. In the discussion below, the charge pump 220 is referred to as the first charge pump 220 and the loop discussed with reference to FIG. 2 is referred to as the first loop.

The frequency divider 320 is coupled between the output 244 of the VCO 240 and a first input of the PFD 330. The frequency divider 320 is configured to divide the frequency of one of the one or more clock signals output by the VCO 240 by the divider N to generate a feedback signal FB and output the feedback signal FB to the first input of the PFD 330. The PFD 330 is configured to receive the feedback signal FB at the first input of the PFD 330 and receive a reference clock signal Ref Clk at a second input of the PFD 330. The PFD 330 is configured to detect the phase difference between the reference signal Ref Clk and the feedback signal FB and generate UP/DN signals based on detected phase difference. The PFD 330 outputs the UP/DN signals to the second charge pump 350.

The second charge pump 350 charges/discharges the loop filter 230 based on the UP/DN signals to generate the control voltage vctrl, which is input to the VCO 240 to tune the frequency of the VCO 240.

The second loop tunes the frequency of the VCO 240 in a direction that reduces the phase difference (i.e., phase error) between the feedback signal FB and the reference clock signal Ref Clk. When the second loop is locked, the frequency of the feedback signal FB is approximately equal to the frequency of the reference clock signal Ref Clk. Since the frequency of the feedback signal FB is approximately equal to the frequency of the VCO 240 divided by N, the second loop sets the frequency of the VCO 240 to a frequency approximately equal to N times the frequency of the reference clock signal Ref Clk.

In the example shown in FIG. 3A, the loop filter 230 includes a first capacitor 310, a second capacitor 314, a resistor 312, and a switch 316. In this example, the first capacitor 310 is coupled between the input 242 of the VCO 240 and ground, the resistor 312 and the switch 316 are coupled in parallel between the input 242 of the VCO 240 and the second capacitor 314, and the second capacitor 314 is coupled between the switch 316 and ground.

In this example, the first loop and the second loop are controlled by a lock detector 340. During operation, the lock detector 340 disables the first loop and enables the second loop to lock the frequency of the VCO 240 to a target frequency range. To enable the second loop, the lock detector 340 turns on the second charge pump 350, opens the switch 316, and turns off the first charge pump 220, as shown in FIG. 3A. In this case, the resistor 312 and the second capacitor 314 form a resistor-capacitor (RC) filter for the second loop.

Figure 3B:
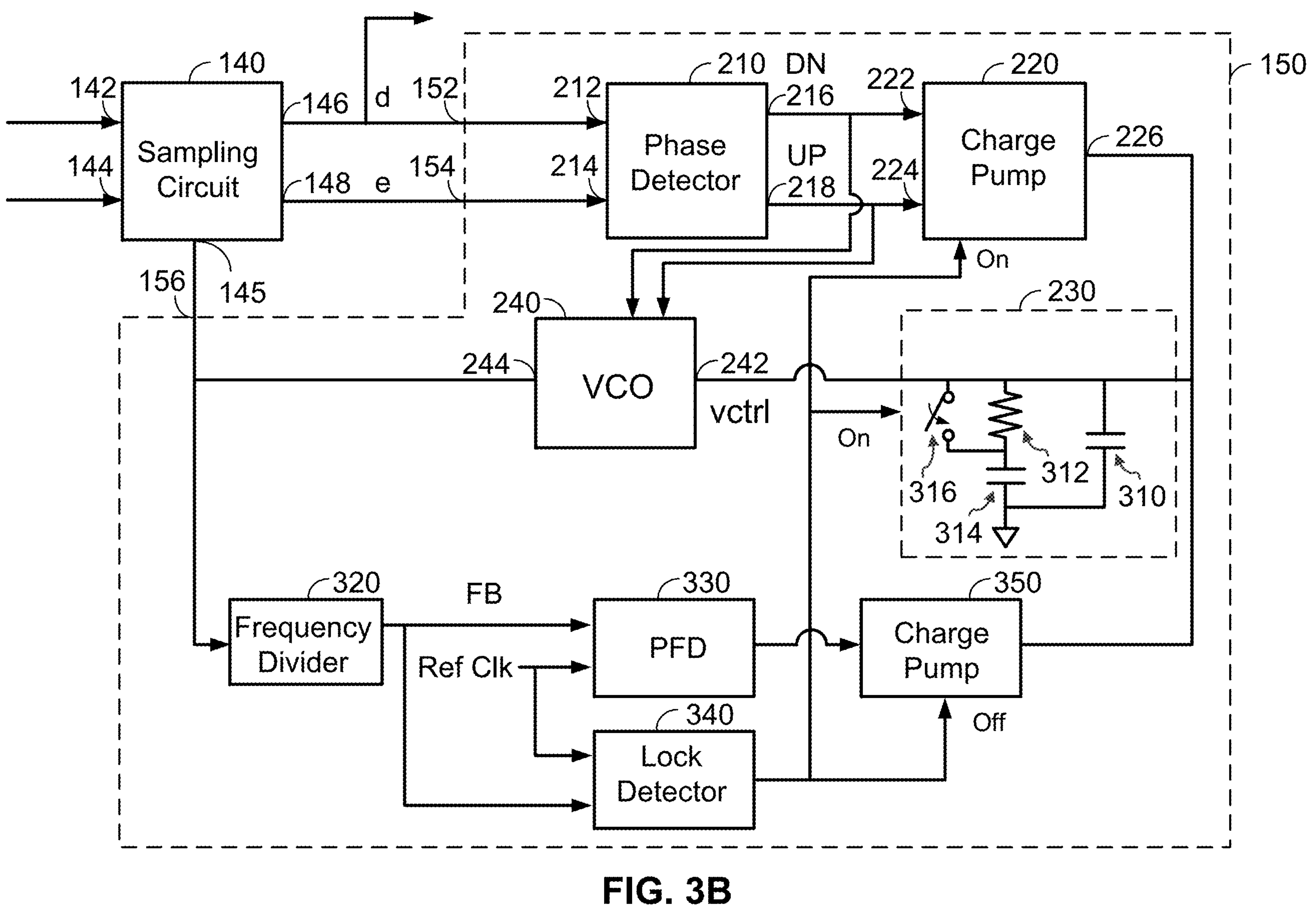
FIG. 3B shows an example in which the additional loop in FIG. 3A is disabled after frequency lock according to certain aspects of the present disclosure.

The lock detector 340 detects when the second loop is locked (i.e., detects frequency lock). For example, the lock detector 340 may receive the feedback signal FB and the reference clock signal Ref Clk and detect frequency look when the feedback signal FB and the reference clock signal Ref Clk have approximately the same frequency. When the lock detector 340 detects the frequency look, the lock detector 340 disables the second loop and enables the first loop. To enable the first loop, the lock detector 340 turns off the second charge pump 350, closes the switch 316 to short the resistor 312, and turns on the first charge pump 220, as shown in FIG. 3B. In this case, the first loop operates as discussed above with reference to FIG. 2.

It is to be appreciated that the CDR circuit 150 may include one or more additional loops in addition to the exemplary loops shown in FIGS. 3A and 3B in some implementations.

As discussed above, the data symbols may be generated using NRZ modulation. In this example, each data symbol is at one of two voltage levels shown in FIG. 4 (labeled "Level 1" and "Level 2") representing a single data bit. For example, in FIG. 4, Level 1 may represent a bit value of 0 and Level 2 may represent a bit value of 1.

Figure 4:
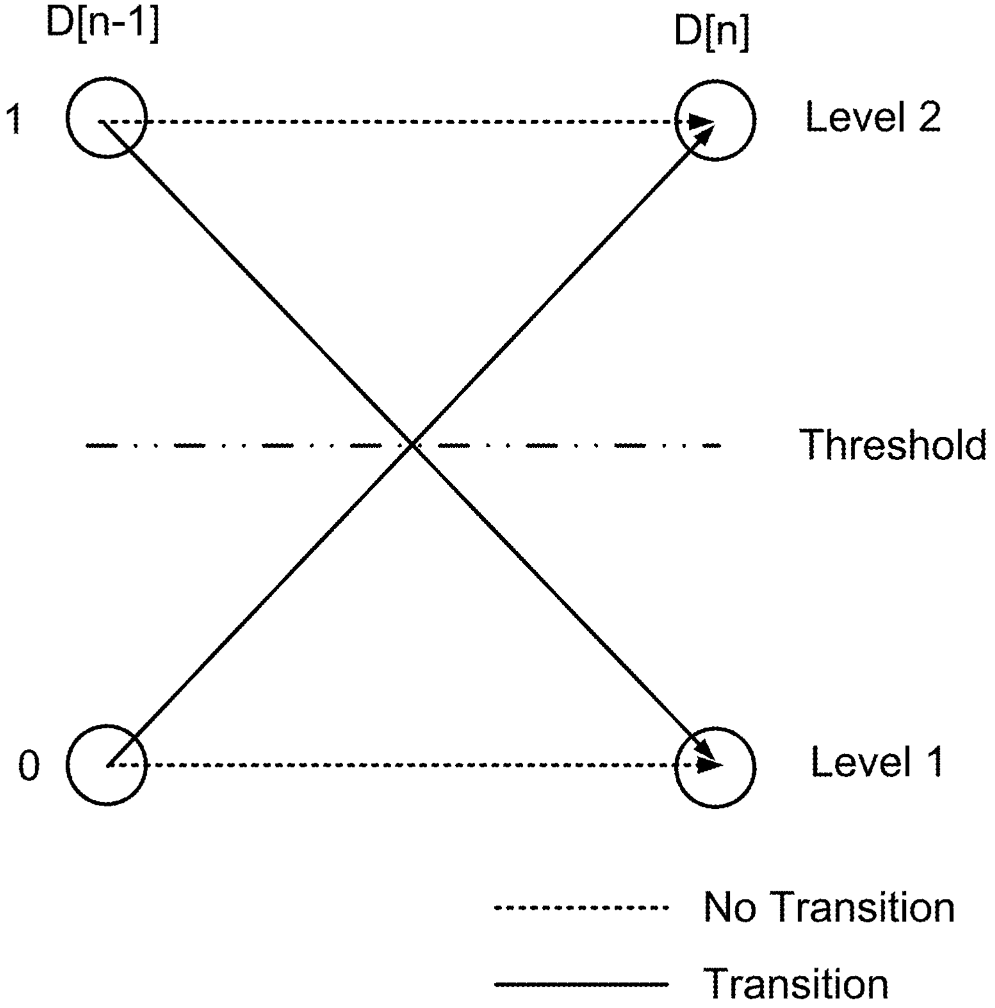
FIG. 4 shows an example of transitions for non-return-to-zero (NRZ) according to certain aspects of the present disclosure.

FIG. 4 shows an example of possible level transitions between adjacent data symbols D[n] and D[n−1] where the data symbol D[n−1] precedes the data symbol D[n]. As shown in FIG. 4, there are two possible level transitions from the data symbol D[n−1] to the data symbol D[n] including a transition from Level 2 to Level 1 and a transition from Level 1 to Level 2. There is no level transition when the data symbols D[n−1] and D[n] are at the same level, as shown in FIG. 4.

NRZ may have an average transition density (TD) of approximately 50% where the TD may be given by the average percentage of level transitions between adjacent data symbols. This assumes that adjacent data symbols have the same level about 50% of the time.

Figure 5:
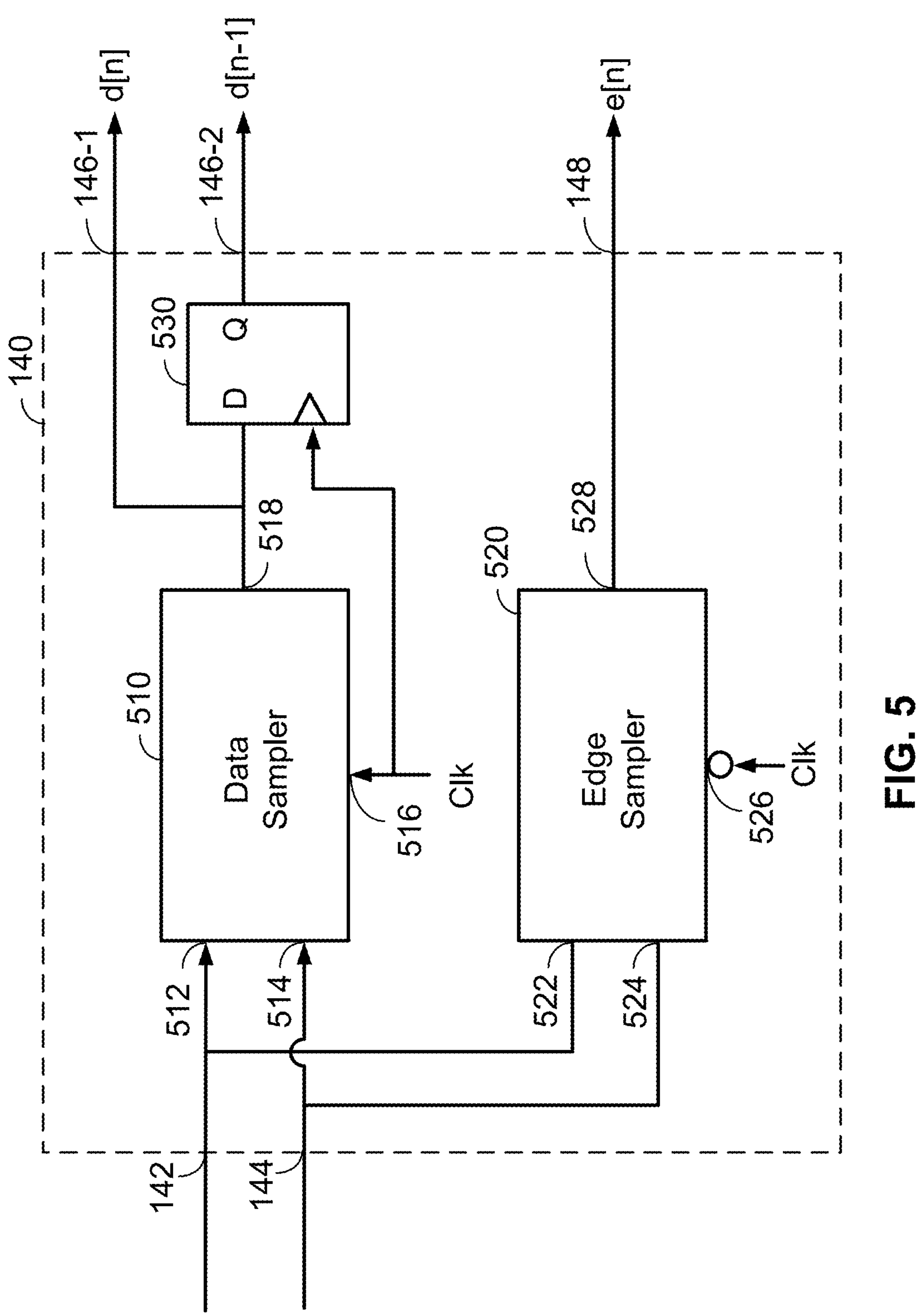
FIG. 5 shows an exemplary implementation of a sampling circuit according to certain aspects of the present disclosure.

FIG. 5 shows an exemplary implementation of the sampling circuit 140 for NRZ and full clock rate according to certain aspects. In this example, the sampling circuit 140 includes a data sampler 510, an edge sampler 520, and a flip-flop 530.

The data sampler 510 has a differential input including a first input 512 coupled to the first input 142 of the sampling circuit 140 and a second input 514 coupled to the second input 144 of the sampling circuit 140. The data sampler 510 also has a clock input 516 coupled to the VCO 240 and an output 518. The data sampler 510 is configured to receive the data signal including the data symbols at the differential input and a clock signal Clk from the VCO 240 at the clock input 516.

During operation, the data sampler 510 is configured to sample the data symbols in the data signal on rising edges of the clock signal Clk, compare the amplitude of each of the sampled data symbols with a data threshold, and output a data bit value of 1 or 0 at the output 518 based on the comparison. For example, the data sampler 510 may output a data bit value of 1 when the amplitude of the respective sampled data symbol is above the data threshold and output a data bit value of 0 when the amplitude of the respective sampled data symbol is below the data threshold. An example of the data threshold is shown in FIG. 4, in which the data threshold is located at the midpoint between Level 1 and Level 2.

The flip-flop 530 has a data input D coupled to the output 518 of the data sampler 510 and a clock input coupled to the clock signal Clk. The flip-flop 530 is configured to delay each data bit by one clock cycle and output the resulting one-cycle delayed data bit at an output Q of the flip-flop 530. Thus, the flip-flop 530 outputs the previous data bit d[n−1] with respect to the data bit d[n] that is currently output by the data sampler 510. In this example, the first output 146 includes output 146-1 for outputting the current data bit d[n] and output 146-2 for outputting the previous data bit d[n−1]. For an example of a half clock rate architecture, the previous data bit d[n−1] precedes the current data bit d[n] by half a clock cycle, as discussed further below.

The edge sampler 520 has a differential input including a first input 522 coupled to the first input 142 of the sampling circuit 140 and a second input 524 coupled to the second input 144 of the sampling circuit 140. The edge sampler 520 also has a clock input 526 coupled to the VCO 240 and an output 528. The data sampler 510 is configured to receive the data signal at the differential input and the clock signal Clk from the VCO 240 at the clock input 526.

During operation, the edge sampler 520 is configured to sample the data signal on falling edges of the clock signal Clk to generate edge samples, compare the amplitude of each of the edge samples with an edge threshold, and output an edge bit value of 1 or 0 at the output 528 based on the comparison. For example, the edge sampler 520 may output an edge bit value of 1 when the amplitude of the respective edge sample is above the edge threshold and output an edge bit value of 0 when the amplitude of the respective edge sample is below the edge threshold. The edge threshold may be the same as or different from the data threshold. Each edge bit e[n] is output from the second output 148 of the sampling circuit 140.

In one example, the data sampling occurs on rising edges of the clock signal Clk and the edge sampling occurs on falling edges of the clock signal Clk. Thus, in this example, the data sampling and the edge sampling are phase offset by approximately 180 degrees (i.e., half of a clock cycle). However, it is to be appreciated that the sampling circuit 140 is not limited to this example. For example, the phase offset may be different for a half clock rate architecture, as discussed further below.

Figure 6:
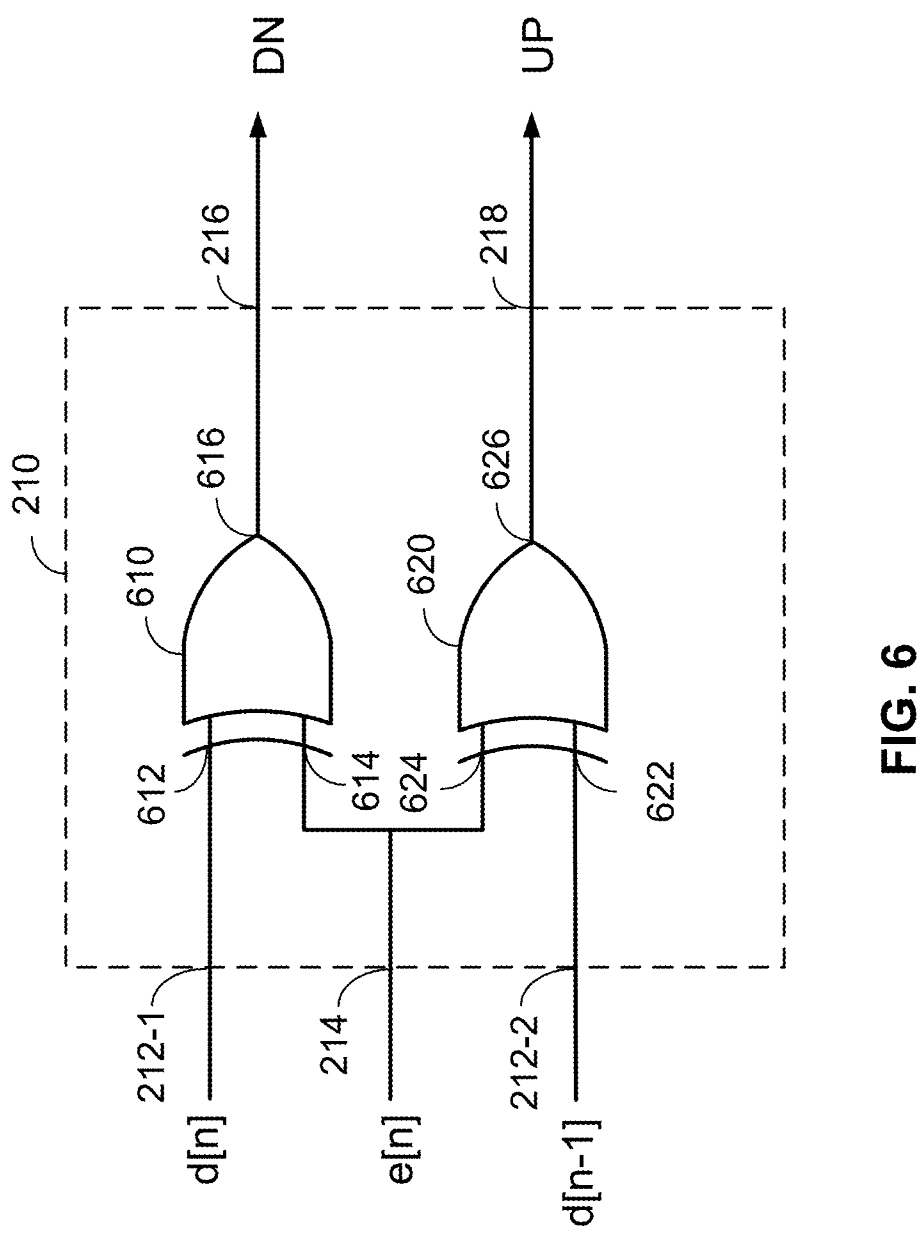
FIG. 6 shows an exemplary implementation of a phase detector according to certain aspects of the present disclosure.

FIG. 6 shows an exemplary implementation of the phase detector 210 according to certain aspects. In this example, the first input 212 includes an input 212-1 for receiving the current data bit d[n] and an input 212-2 for receiving the previous data bit d[n−1].

In the example in FIG. 6, the phase detector 210 includes a bang-bang phase detector including a first exclusive-OR gate 610 and a second exclusive-OR gate 620. The first exclusive-OR gate 610 has a first input 612 coupled to the input 212-1 to receive the current data bit d[n], a second input 614 coupled to the input 214 to receive the edge bit e[n], and an output 616 coupled to the first output 216 of the phase detector 210. In this example, the first exclusive-OR gate 610 performs an exclusive-OR operation on the current data bit d[n] and the edge bit e[n] to generate the DN signal.

The second exclusive-OR gate 620 has a first input 622 coupled to the input 212-2 to receive the previous data bit d[n−1], a second input 624 coupled to the input 214 to receive the edge bit e[n], and an output 626 coupled to the second output 218 of the phase detector 210. In this example, the second exclusive-OR gate 620 performs an exclusive-OR operation on the previous data bit d[n] and the edge bit e[n] to generate the UP signal.

It is to be appreciated that in other implementations, the first exclusive-OR gate 610 may output the UP signal and the second exclusive-OR gate 620 may output the DN signal depending, for example, on whether the frequency of the VCO 240 is configured to increase with increasing control voltage vctrl or increase with decreasing control voltage vctrl. It is also to be appreciated that each of the exclusive-OR gates 610 and 620 may be implemented with a combination of logic gates.

Figure 7:
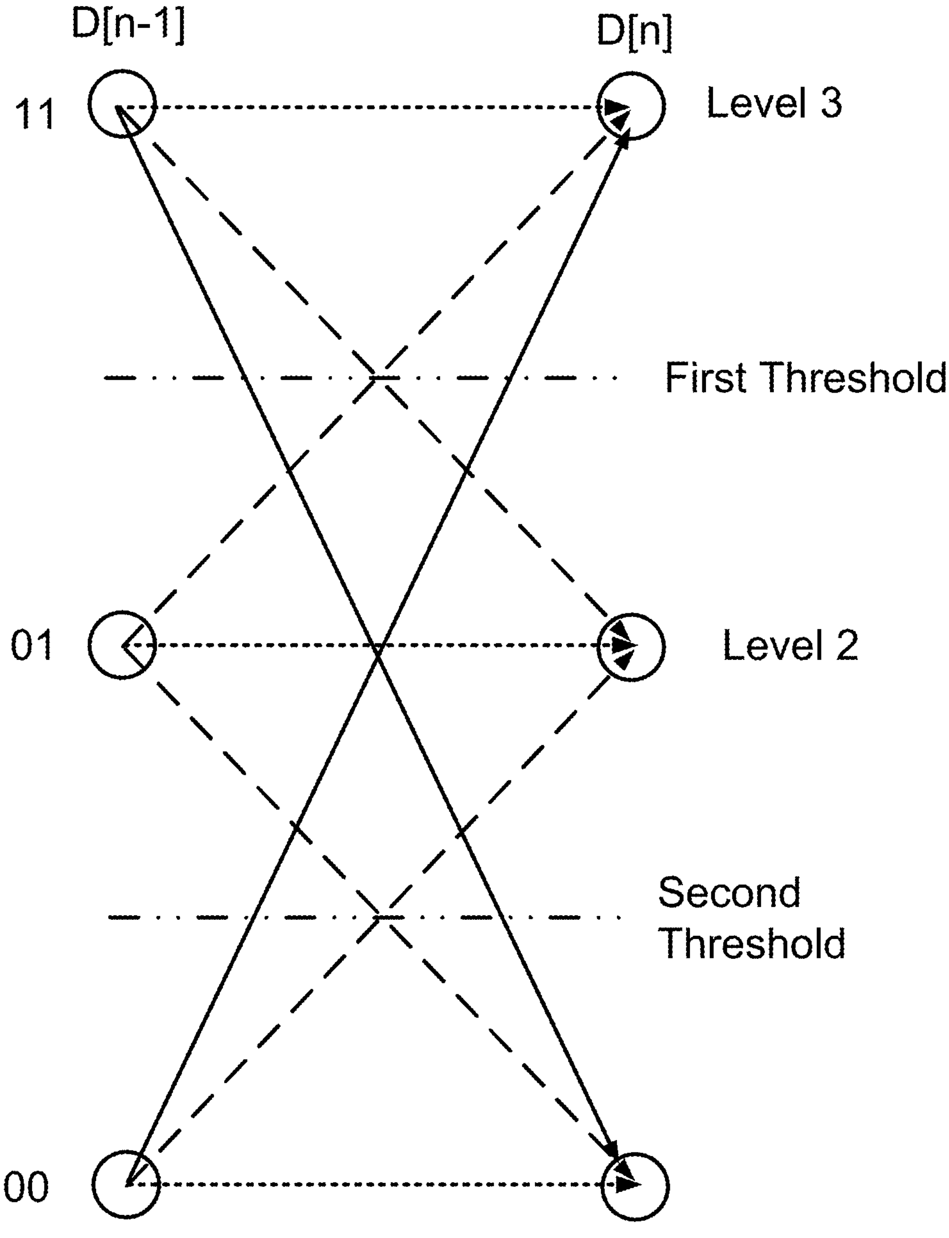
FIG. 7 shows an example of transitions for pulse amplitude modulation 3-level (PAM3) according to certain aspects of the present disclosure.

As discussed above, the data symbols may be generated using PAM3 modulation. In this example, each data symbol is at one of three voltage levels shown in FIG. 7 (labeled "Level 1", "Level 2", and "Level 3"). In this example, each level corresponds to respective set of two bit values. For example, Level 1 may correspond to bit values 00, Level 2 may correspond to bit values 01, and Level 3 may correspond to bit values 11, as shown in FIG. 7. Since PAM3 modulation has more levels than NRZ, PAM3 may be used to transmit data bits at higher data rates for a given clock frequency.

FIG. 7 shows an example of possible level transitions between adjacent data symbols D[n] and D[n−1] where the data symbol D[n−1] precedes the data symbol D[n]. As shown in FIG. 7, there are six possible level transitions from the data symbol D[n−1] to the data symbol D[n] including a transition from Level 1 to Level 3, a transition from Level 1 to Level 2, a transition from Level 2 to Level 3, a transition from Level 3 to Level 1, a transition from Level 3 to Level 2, and a transition from Level 2 to Level 1. There is no level transition when the data symbols D[n−1] and D[n] are at the same level, as shown in FIG. 7.

PAM3 may have an average transition density (TD) of approximately 67% where the TD may be given by the average percentage of level transitions between adjacent data symbols. The TD for transitions between Level 1 and Level 3 may be approximately 22% since a third of the level transitions are between Level 1 and Level 3. In FIG. 7, level transitions between Level 1 and Level 3 are shown with solid arrows and the remaining level transitions are shown with dashed arrows.

Figure 8:
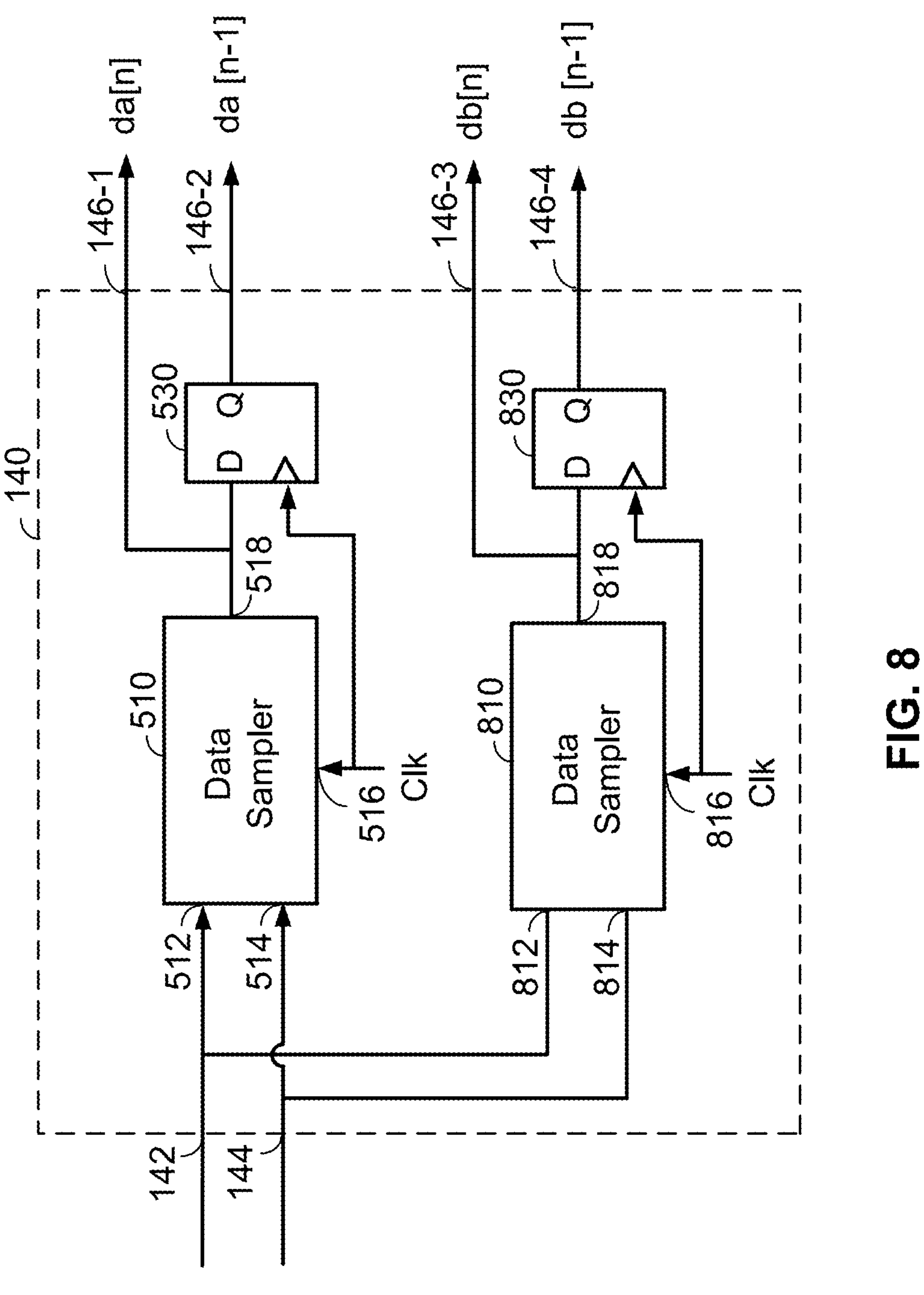
FIG. 8 shows another exemplary implementation of a sampling circuit according to certain aspects of the present disclosure.

FIG. 8 shows an exemplary implementation of the sampling circuit 140 for PAM3 and full clock rate according to certain aspects. In this example, the sampling circuit 140 includes the data sampler 510 and the flip-flop 530 discussed above. The sampling circuit 140 also includes a second data sampler 810 and a second flip-flop 830. In the discussion below, the data sampler 510 is referred to as the first data sampler 510 and the flip-flop 530 is referred to as the first flip-flop 530. Note that the edge sampler 520 is not shown in FIG. 8 for ease of illustration.

In this example, the sampling circuit 140 outputs a set of two data bits da[n] and db[n] for each sampled data symbol in the data signal. The set of data bits da[n] and db[n] may have the bit values 00 for Level 1, the bit values 01 for Level 2, and the bit values 11 for Level 3. In this example, the first data sampler 510 is used to generate the first data bit da[n] in each set of data bits and the second data sampler 810 is used to generate the second data bit db[n] in each set of data bits.

In this example, the first data sampler 510 is configured to sample the data symbols in the data signal on rising edges of the clock signal Clk, compare the amplitude of each of the sampled data symbols with a first threshold, and output a data bit value of 1 or 0 for the data bit da[n] based on the comparison. For example, the first data sampler 510 may output a data bit value of 1 when the amplitude of the respective sampled data symbol is above the first threshold and output a data bit value of 0 when the amplitude of the respective sampled data symbol is below the first threshold. An example of the first threshold is shown in FIG. 7, in which the first threshold is located between Level 2 and Level 3. The first flip-flop 530 delays the data bit da[n] by one clock cycle, as discussed above.

The second data sampler 810 has a differential input including a first input 812 coupled to the first input 142 of the sampling circuit 140 and a second input 814 coupled to the second input 144 of the sampling circuit 140. The second data sampler 810 also has a clock input 816 coupled to the VCO 240 and an output 818. The second data sampler 810 is configured to receive the data symbols at the differential input and the clock signal Clk from the VCO 240 at the clock input 816.

During operation, the second data sampler 810 is configured to sample the data symbols in the data signal on rising edges of the clock signal Clk, compare the amplitude of each of the sampled data symbols with a second threshold, and output a data bit value of 1 or 0 for the data bit db[n] at the output 818 based on the comparison. For example, the second data sampler 810 may output a data bit value of 1 when the amplitude of the respective sampled data symbol is above the second threshold and output a data bit value of 0 when the amplitude of the respective sampled data symbol is below the second threshold. An example of the second threshold is shown in FIG. 7, in which the second threshold is located between Level 1 and Level 2.

The second flip-flop 830 has a data input D coupled to the output 818 of the second data sampler 810 and a clock input coupled to the clock signal Clk. The second flip-flop 830 is configured to delay each data bit da[n] by one clock cycle and output the resulting one-cycle delayed data bit at an output Q of the second flip-flop 830. Thus, the second flip-flop 830 outputs the previous data bit db[n−1] with respect to the data bit db[n] that is currently output by the second data sampler 810. In this example, the first output 146 includes output 146-3 for outputting the current data bit db[n] and output 146-4 for outputting the previous data bit db[n−1].

In this example, the sampling circuit 140 samples the data symbol D[n−1] during a first sampling time to generate the data bits da[n−1] and db[n−1] as discussed above, samples the data signal during a second sampling time to generate an edge bit e[n] as discussed above, and samples the data symbol D[n] during a third sampling time to generate the data bits da[n] and db[n] as discussed above. The second sampling time is between the first sampling time and the third sampling time to detect the transition between the data symbols D[n−1] and D[n]. In certain aspects, the first sampling time and the third sampling time are separated by a unit interval (UI) of the data signal, and the second sampling time is separated from each of the first sampling time and the third sampling time by half a UI. As used herein, a "unit interval" is a period of one data symbol.

The sampling circuit 140 may include multiple edge samplers (e.g., multiple instances of the edge sampler 520 in FIG. 5) with different edge thresholds for detecting different level transitions between adjacent data symbols. A larger number of edge samplers allows a greater number of different level transitions to be detected. However, a larger number of edge samplers increases area and power consumption. Also, a larger number of edge samplers increases the complexity, area, and power consumption of the phase detector 210.

To address the above, aspects of the present disclosure provide a pattern transition filter that confines the phase detector 210 to transitions between Level 1 and Level 3 by filtering output the other transitions (e.g., transitions between Level 2 and Level 3 and transitions between Level 1 and Level 2). This reduces the number of edge samplers needed by the phase detector 210, which helps reduce the complexity, area, and power consumption of the phase detector 210. The above features and other features of the present disclosure are discussed further below.

Figure 9:
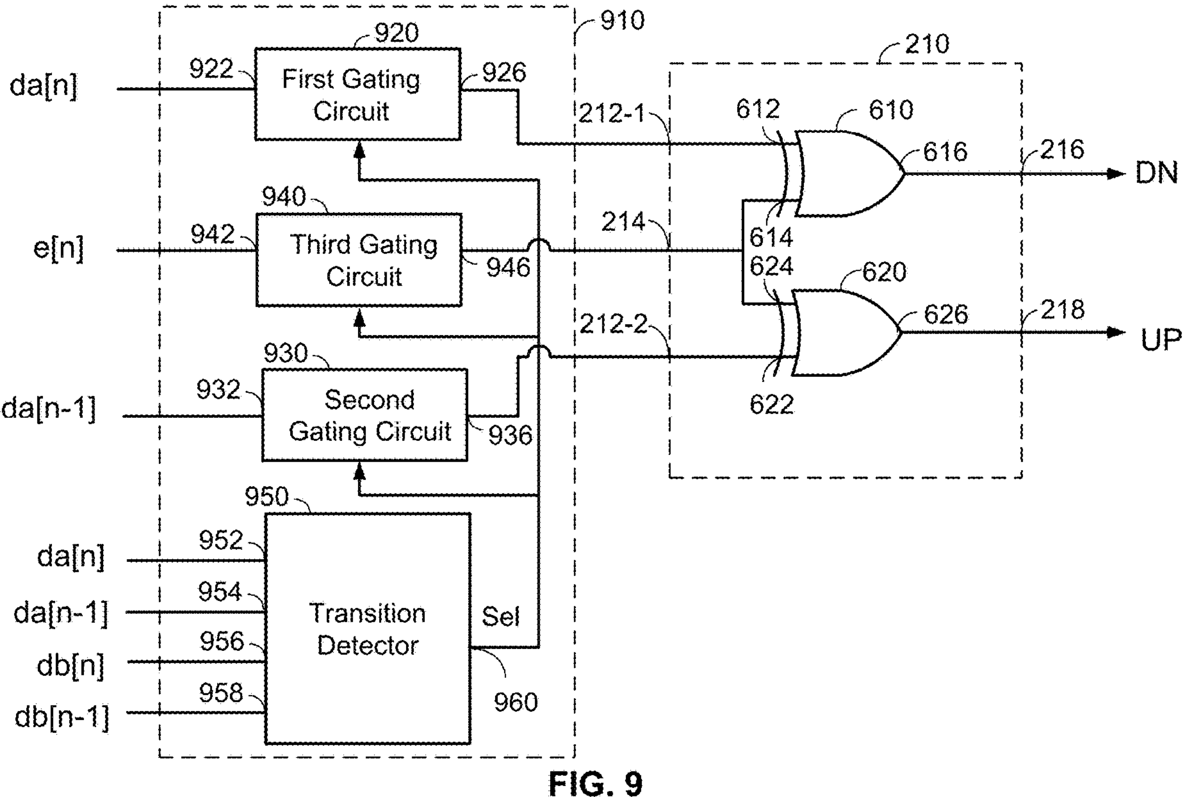
FIG. 9 shows an example of a pattern transition filter according to certain aspects of the present disclosure.

FIG. 9 shows an example of a pattern transition filter 910 according to certain aspects. The pattern transition filter 910 may be located between the sampling circuit 140 (shown in FIG. 8) and the phase detector 210. In this example, the phase detector 210 may be implemented using the same implementation used for NRZ modulation in FIG. 6. This is because the pattern transition filter 910 confines the phase detector 210 to transitions between two levels (e.g., transitions between Level 1 and Level 3) by filtering out the other transitions, as discussed further below.

In this example, the pattern transition filter 910 is configured to detect a level transition between Level 1 and Level 3. As used herein, a transition between Level 1 and Level 3 means a transition from Level 1 to Level 3 or a transition from Level 3 to Level 1. When the pattern transition filter 910 detects the transition between Level 1 and Level 3, the pattern transition filter 910 passes the data bits da[n] and da[n−1] and the edge bit e[n] to the phase detector 210 to generate the UP signal or the DN signal. When the pattern transition filter 910 does not detect a transition between Level 1 and Level 3, the pattern transition filter 910 blocks (i.e., filters out) the data bits da[n] and da[n−1] and the edge bit e[n] from the phase detector 210. As a result, the pattern transition filter 910 confines the phase detector 210 to transitions between Level 1 and Level 3 and filters out the other transitions.

In this example, the data bits db[n] and db[n−1] do not need to be input to the phase detector 210. This is because the bit values of the data bits da[n] and da[n−1] provide enough information to determine whether the corresponding data symbol is at Level 1 or Level 3. For example, a bit value of 1 for da[n] indicates Level 3 and a bit value of 0 for da[n] indicates Level 1.

In the example in FIG. 9, the pattern transition filter 910 includes a transition detector 950, a first gating circuit 920, a second gating circuit 930, and a third gating circuit 940.

The first gating circuit 920 has an input 922 and an output 924. The input 922 is coupled to the output 146-1 of the sampling circuit 140 (shown in FIG. 8) to receive the data bit da[n]. The output 926 is coupled to the input 212-1 of the phase detector 210. The first gating circuit 920 is configured to selectively gate the data bit da[n] under the control of the transition detector 950, as discussed further below.

The second gating circuit 930 has an input 932 and an output 934. The input 932 is coupled to the output 146-2 of the sampling circuit 140 (shown in FIG. 8) to receive the data bit da[n−1]. The output 936 is coupled to the input 212-2 of the phase detector 210. The second gating circuit 930 is configured to selectively gate the data bit da[n−1] under the control of the transition detector 950, as discussed further below.

The third gating circuit 940 has an input 942 and an output 944. The input 942 is coupled to the output 148 of the sampling circuit 140 (shown in FIG. 5) to receive the edge bit e[n]. The output 946 is coupled to the input 214 of the phase detector 210. The third gating circuit 940 is configured to selectively gate the edge bit e[n] under the control of the transition detector 950, as discussed further below. In this example, the edge sampler 520 (shown in FIG. 5) may generate the edge bit e[n] in which the threshold of the edge sampler 520 is located between Level 1 and Level 3 (e.g., the midpoint between Level 1 and Level 3) to detect transitions between Level 1 and Level 3.

The transition detector 950 has a first input 952 coupled to the output 146-1 of the sampling circuit 140 to receive the data bit da[n], a second input 954 coupled to the output 146-2 of the sampling circuit 140 to receive the data bit da[n−1], a third input 956 coupled to the output 146-3 of the sampling circuit 140 to receive the data bit db[n], and a fourth input 958 coupled to the output 146-4 of the sampling circuit 140 to receive the data bit db[n−1]. The transition detector 950 also has an output 960 coupled to the gating circuits 920, 930, and 940. In this example, the data bits da[n] and db[n] correspond to the data symbol D[n] and indicate the level of the data symbol D[n]. The data bits da[n−1] and db[n−1] correspond to the data symbol D[n−1] and indicate the level of the data symbol D[n−1].

The transition detector 950 is configured to generate and output a select signal Se1 to control the gating circuits 920, 930, and 940. For example, the transition detector 950 may cause the gating circuits 920, 930, and 940 to pass the data bits da[n] and da[n−1] and the edge bit e[n] by setting the select signal to a first logic value and cause the gating circuits 920, 930, and 940 to gate (i.e., block) the data bits da[n] and da[n−1] and the edge bit e[n] by setting the select signal to a second logic value. The first logic value may be 1 and the second logic value may be 0, or vice versa.

During operation, the transition detector 950 detects a level transition between Level 1 and Level 3 based on the data bits da[n], db[n], da[n−1], and da[n−1]. For example, the transition detector 950 may be configured to detect a transition between Level 1 and Level 3 if the data bits da[n] and da[n−1] have different bit values and the data bits db[n] and db[n−1] have different bit values. When the transition detector 950 detects the transition between Level 1 and Level 3, the transition detector 950 causes the gating circuits 920, 930, and 940 to pass the data bits da[n] and da[n−1] and the edge bit e[n] to the phase detector 210 (e.g., by outputting the first logic value for the select signal). When the transition detector 950 does not detect the transition between Level 1 and Level 3, the transition detector 950 causes the gating circuits 920, 930, and 940 to gate (i.e., block) the data bits da[n] and da[n−1] and the edge bit e[n] (e.g., by setting the select signal to the second logic value). In this case, the phase detector 210 does not output an UP signal or a DN signal.

Figure 10:
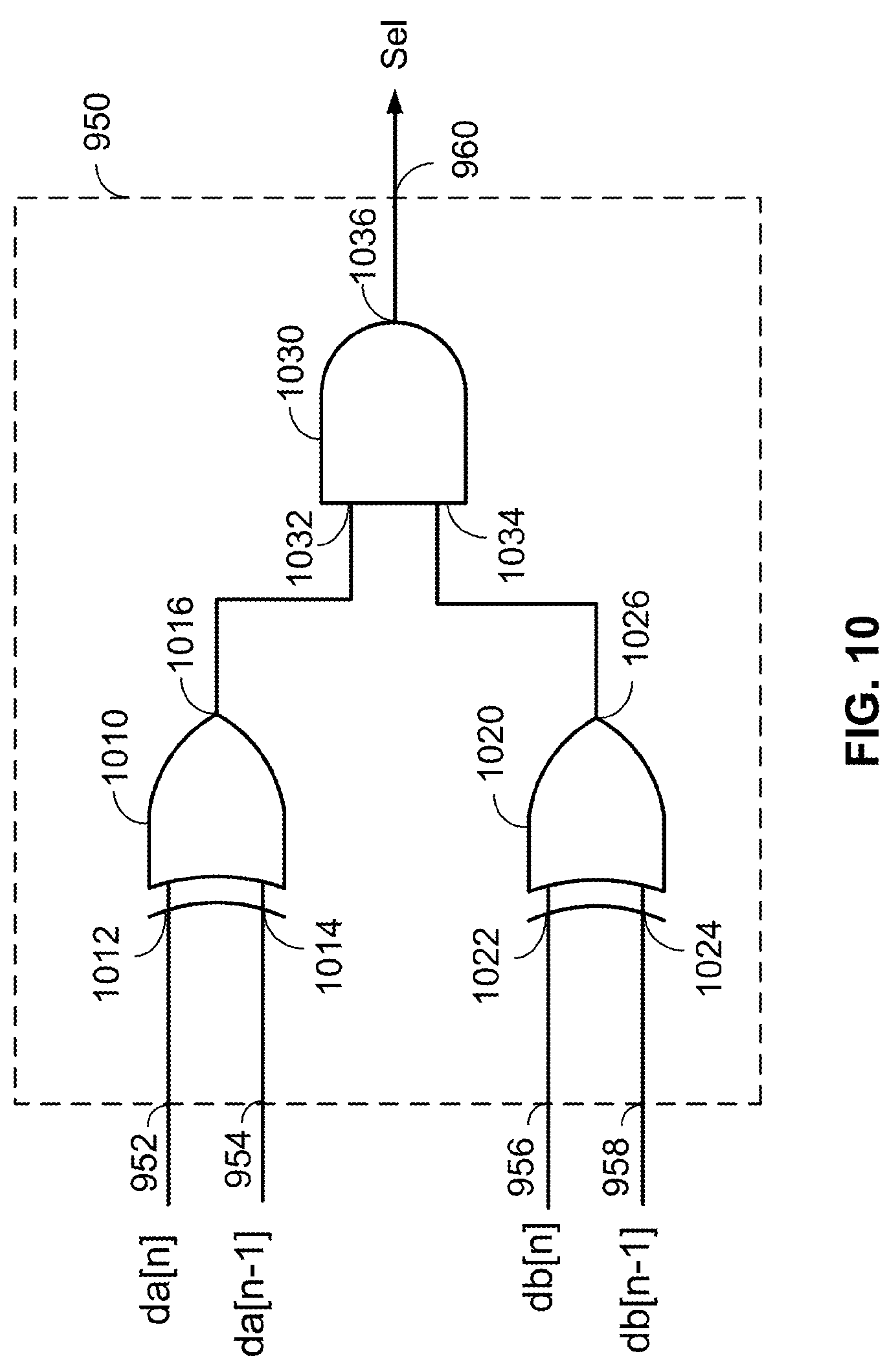
FIG. 10 shows an exemplary implementation of a transition detector according to certain aspects of the present disclosure.

FIG. 10 shows an exemplary implementation of the transition detector 950. In this example, the transition detector 950 includes a first exclusive-OR gate 1010, a second exclusive-OR gate 1020, and an AND gate 1030. The first exclusive-OR gate 1010 has a first input 1012 coupled to the input 952, a second input 1014 coupled to the input 954, and an output 1016. The second exclusive-OR gate 1020 has a first input 1022 coupled to the input 956, a second input 1024 coupled to the input 958, and an output 1016. The AND gate has a first input 1032 coupled to the output 1016 of the first exclusive-OR gate 1010, a second input 1034 coupled to the output 1026 of the second exclusive-OR gate, and an output 1036 coupled to the output 960 of the transition detector 950. The AND gate 1030 may be implemented with a NAND gate and an inverter in some implementations.

In this example, the transition detector 950 detects a transition between Level 1 and Level 3 if the data bits da[n] and da[n−1] are different and the data bits db[n] and db[n−1] are different. In this case, both exclusive-OR gates 1010 and 1020 output a 1 to the AND gate 1030, which causes the AND gate 1030 to output a 1 for the select signal Se1 at the output 960. Thus, in this example, the transition detector 950 outputs a 1 for the select signal Se1 when the transition between Level 1 and Level 3 is detected. In this example, the gating circuits 920, 930, and 940 may be configured to pass the data bits da[n] and da[n−1] and the edge bit e[n], respectively, to the phase detector 210 if the select signal Se1 is 1 and block the data bits da[n] and da[n−1] and the edge bit e[n] if the select signal is 0.

Figure 11:
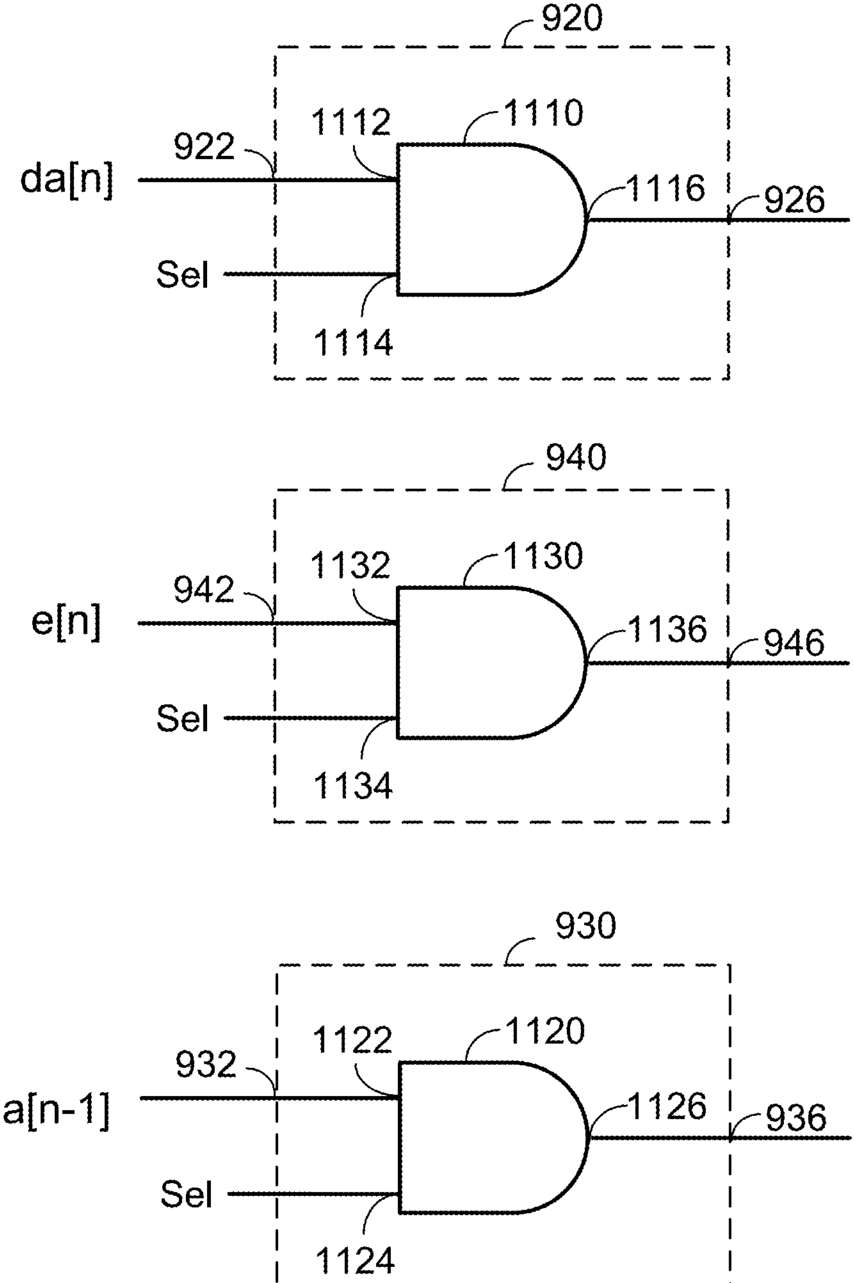
FIG. 11 shows an exemplary implementation of gating circuits according to certain aspects of the present disclosure.

FIG. 11 shows an exemplary implementation of the gating circuits 920, 930, and 940 according to certain aspects. In this example, the first gating circuit 920 includes a first AND gate 1110 having a first input 1112 coupled to the input 922 to receive the data bit da[n], a second input 1114 coupled to the output 960 of the transition detector 950 (shown in FIG. 9) to receive the select signal Se1, and an output 1116 coupled to the output 926. The second gating circuit 930 includes a second AND gate 1120 having a first input 1122 coupled to the input 932 to receive the data bit da[n−1], a second input 1124 coupled to the output 960 of the transition detector 950 (shown in FIG. 9) to receive the select signal Se1, and an output 1126 coupled to the output 936. The third gating circuit 940 includes a third AND gate 1130 having a first input 1132 coupled to the input 942 to receive the edge bit e[n], a second input 1134 coupled to the output 960 of the transition detector 950 (shown in FIG. 9) to receive the select signal Se1, and an output 1136 coupled to the output 946. In some implementations, each of the AND gates 1110, 1120, and 1130 be implemented with a respective NAND gate and a respective inverter.

In certain aspects, the pattern transition filter 910 may be configured to operate in an NRZ mode or a PAM3 mode. In the PAM3 mode, the pattern transition filter 910 operates as discussed above. In the NRZ mode, the data bits d[n] and d[n−1] are input to the pattern transition filter 910 and the gating circuits 920, 930, and 940 may be configured to pass all data bits and all edge bits to the phase detector 210 (e.g., the select signal Se1 may be held at the first logic value). In this case, transition filtering is disabled since transition filtering is not needed for NRZ.

Aspects of the present disclosure may be used in a full clock rate architecture, in which the first sampling time and the third sampling time for sampling the data symbols D[n−1] and D[n], respectively, are separated by one clock cycle and the second sampling time is separated from each of the first and third sampling times by half of a clock cycle.

Aspects of the present disclosure may also be used in a half clock rate architecture (also referred to as half clock speed). In this case, the first sampling time and the third sampling time are separated by half a clock cycle and the second sampling time is separated from each of the first and third sampling times by a quarter of a clock cycle. This is because, in a half rate clock architecture, the clock frequency used for sampling is half the frequency of the data signal. In a half rate clock architecture, the sampling circuit 140 may include two instances of the data samplers 510 and 810 and two instances of the edge sampler 520 that are time interleaved. In this example, the first instance of the data samplers 510 and 810 may sample odd data symbols in the data signal using a first clock signal, and the first instance of the edge sampler 520 may sample the data signal using a second clock signal that is phase offset from the first clock signal by 90 degrees. Also, the second instance of the data samplers 510 and 810 may sample even data symbols in the data signal using a third clock signal that is phase offset from the first clock signal by 180 degrees, and the second instance of the edge sampler 520 may sample the data signal using a fourth clock signal that is phase offset from the third clock signal by 90 degrees. In this example, the pattern transition filter 910 may include two instances of the gating circuits 920, 930, and 940 and two instances of the transition detector 950 and the system may include two instances of the phase detector 210. In this example, the first, second, third, and fourth clock signals have the same frequency (e.g., VCO frequency) and are phase offset from one another.

In both the full clock rate architecture and the half rate clock architecture, the first sampling time and the third sampling time may be separated by one UI and the second sampling time may be separated from each of the first sampling time and the third sampling time by half a UI. For the case of the full clock rate architecture, one UI corresponds to one clock period. For the case of the half rate architecture, one UI corresponds to half a clock period (i.e., a clock period spans two UIs).

Figure 12:
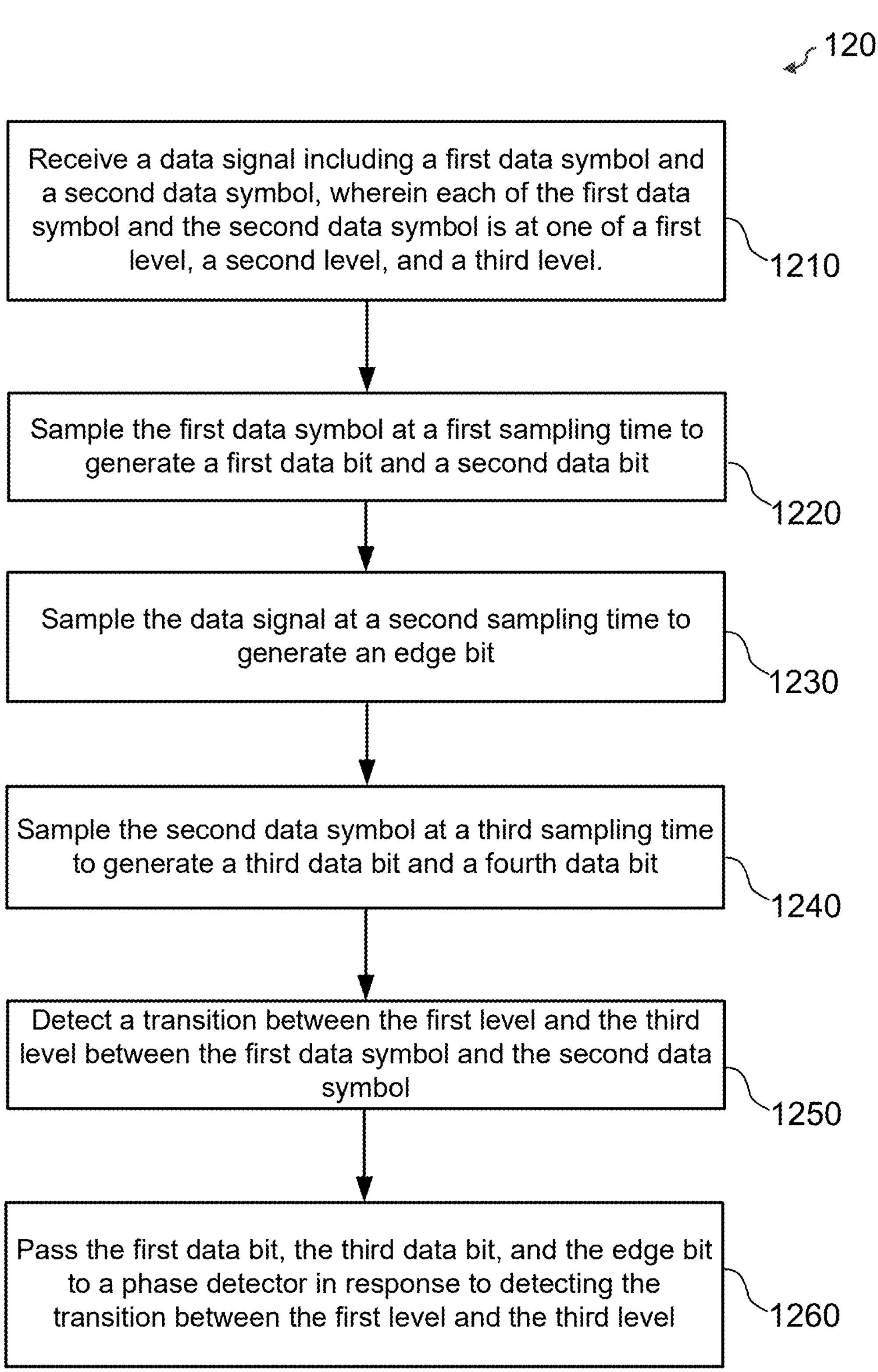
FIG. 12 is a flowchart illustrating a method for transition filtering according to certain aspects of the present disclosure.

FIG. 12 illustrated an exemplary method for transition filtering according to certain aspects.

At block 1210, a data signal including a first data symbol and a second data symbol is received, wherein each of the first data symbol and the second data symbol is at one of a first level, a second level, and a third level. For example, the first data symbol may correspond to data symbol D[n−1] and the second data symbol may correspond to the data symbol D[n]. The first level, the second level, and the third level may correspond to Level 1, Level 2, and Level 3, respectively, illustrated in FIG. 7.

At block 1220, the first data symbol is sampled at a first sampling time to generate a first data bit and a second data bit. For example, the first data bit may correspond to data bit da[n−1] and the second data bit may correspond to data bit db[n−1]. The sampling circuit 140 may sample the first data symbol.

At block 1230, the data signal is sampled at a second sampling time to generate an edge bit. For example, the edge bit may correspond to the edge bit e[n]. The sampling circuit 140 may sample the data signal.

At block 1240, the second data symbol is sampled at a third sampling time to generate a third data bit and a fourth data bit. For example, the third data bit may correspond to data bit da[n] and the fourth data bit may correspond to data bit db[n]. The sampling circuit 140 may sample the second data symbol.

At block 1250, a transition between the first level and the third level between the first data symbol and the second data symbol is detected. For example, the transition detector 950 may detect the transition between the first level and the third level.

At block 1260, the first data bit, the third data bit, and the edge bit are passed to a phase detector in response to detecting the transition between the first level and the third level. For example, the gating circuits 920, 930, and 940 may pass the first data bit, the third data bit, and the edge bit to the phase detector (e.g., phase detector 210).

In certain aspects, detecting the transition between the first level and the third level includes detecting the first data bit and the third data bit have different bit values, and detecting the second data bit and the fourth data bit have different bit values.

Implementation examples are described in the following numbered clauses:

1. A system, comprising:

a sampling circuit, wherein the sampling circuit is configured to:

receive a data signal including a first data symbol and a second data symbol, wherein each of the first data symbol and the second data symbol is at one of a first level, a second level, and a third level;

sample the first data symbol at a first sampling time to generate a first data bit and a second data bit;

sample the data signal at a second sampling time to generate an edge bit; and sample the second data symbol at a third sampling time to generate a third data bit and a fourth data bit;

a phase detector; and a transition filter coupled between the sampling circuit and the phase detector, wherein the transition filter is configured to:

receive the first data bit, the third data bit, and the edge bit;

detect a transition between the first level and the third level between the first data symbol and the second data symbol; and pass the first data bit, the third data bit, and the edge bit to the phase detector if the transition between the first level and the third level is detected.

2. The system of clause 1, wherein the transition filter is configured to block the first data bit, the third data bit, and the edge bit from the phase detector if the transition between the first level and the third level is not detected.

3. The system of clause 1 or 2, wherein the second level is between the first level and the third level.

4. The system of any one of clauses 1 to 3, wherein the transition filter is configured to:

receive the second data bit and the fourth data bit; and detect the transition between the first level and the third level if the first data bit and the third data bit have different bit values and the second data bit and the fourth data bit have different bit values.

5. The system of clause 4, wherein the transition filter is configured to block the first data bit, the third data bit, and the edge bit from the phase detector if the first data bit and the third data bit have a same bit value.

6. The system of clause 4 or 5, wherein the transition filter is configured to block the first data bit, the third data bit, and the edge bit from the phase detector if the second data bit and the fourth data bit have a same bit value.

7. The system of any one of clauses 1 to 6, wherein the data signal is modulated using pulse amplitude modulation 3-level (PAM3).

8. The system of any one of clauses 1 to 7, wherein the first sampling time and the third sampling time are separated by a unit interval (UI) of the data signal.

9. The system of clause 8, wherein the second sampling time is between the first sampling time and the third sampling time.

10. The system of any one of clauses 1 to 9, wherein the phase detector comprises a bang-bang phase detector.

11. The system of clause 10, wherein the bang-bang phase detector includes:

a first exclusive-OR gate having a first input, a second input, and an output, wherein the first input of the first exclusive-OR gate is configured to receive the first data bit, and the second input of the first exclusive-OR gate is configured to receive the edge bit; and a second exclusive-OR gate having a first input, a second input, and an output, wherein the first input of the second exclusive-OR gate is configured to receive the third data bit, and the second input of the second exclusive-OR gate is configured to receive the edge bit.

12. A system, comprising:

a sampling circuit, wherein the sampling circuit is configured to:

receive a data signal including a first data symbol and a second data symbol, wherein each of the first data symbol and the second data symbol is at one of a first level, a second level, and a third level;

sample the first data symbol at a first sampling time to generate a first data bit and a second data bit;

sample the data signal at a second sampling time to generate an edge bit; and sample the second data symbol at a third sampling time to generate a third data bit and a fourth data bit;

a phase detector; and a transition filter coupled between the sampling circuit and the phase detector, wherein the transition filter comprises:

a first gating circuit configured to receive the first data bit;

a second gating circuit configured to receive the third data bit;

a third gating circuit configured to receive the edge bit; and a transition detector configured to:

receive the first data bit, the second data bit, the third data bit, and the fourth data bit; and cause the first gating circuit, the second gating circuit, and the third gating circuit to pass the first data bit, the third data bit, and the edge bit, respectively, to the phase detector if the first data bit and the third data bit have different bit values and the second data bit and the fourth data bit have different bit values.

13. The system of clause 12, wherein the first gating circuit comprises a first AND gate, the second gating circuit comprises a second AND gate, and the third gating circuit comprises a third AND gate.

14. The system of clause 12 or 13, wherein the transition detector is configured to cause the first gating circuit, the second gating circuit, and the third gating circuit to block the first data bit, the third data bit, and the edge bit, respectively, from the phase detector if the first data bit and the third data bit have a same bit value.

15. The system of any one of clauses 12 to 14, wherein the transition detector is configured to cause the first gating circuit, the second gating circuit, and the third gating circuit to block the first data bit, the third data bit, and the edge bit, respectively, from the phase detector if the second data bit and the fourth data bit have a same bit value.

16. The system of any one of clauses 12 to 15, wherein the second level is between the first level and the third level.

17. The system of any one of clauses 12 to 16, wherein the data signal is modulated using pulse amplitude modulation 3-level (PAM3).

18. The system of any one of clauses 12 to 17, wherein the first sampling time and the third sampling time are separated by a unit interval (UI) of the data signal.

19. The system of clause 18, wherein the second sampling time is between the first sampling time and the third sampling time.

20. The system of any one of clauses 12 to 19, wherein the phase detector comprises a bang-bang phase detector.

21. The system of any one of clauses 12 to 20, wherein the transition detector comprises:

a first exclusive-OR gate having a first input, a second input, and an output, wherein the first input of the first exclusive-OR gate is configured to receive the first data bit, and the second input of the first exclusive-OR gate is configured to receive the third data bit;

a second exclusive-OR gate having a first input, a second input, and an output, wherein the first input of the second exclusive-OR gate is configured to receive the second data bit, and the second input of the second exclusive-OR gate is configured to receive the fourth data bit; and an AND gate having a first input, a second input, and a third input, wherein the first input of the AND gate is coupled to the output of the first exclusive-OR gate, the second input of the AND gate is coupled to the output of the second exclusive-OR gate, and the output of the AND gate is coupled to the first gating circuit, the second gating circuit, and the third gating circuit.

22. A method for transition filtering, comprising:

receiving a data signal including a first data symbol and a second data symbol, wherein each of the first data symbol and the second data symbol is at one of a first level, a second level, and a third level;

sampling the first data symbol at a first sampling time to generate a first data bit and a second data bit;

sampling the data signal at a second sampling time to generate an edge bit;

sampling the second data symbol at a third sampling time to generate a third data bit and a fourth data bit;

detecting a transition between the first level and the third level between the first data symbol and the second data symbol; and passing the first data bit, the third data bit, and the edge bit to a phase detector in response to detecting the transition between the first level and the third level.

23. The method of clause 22, wherein detecting the transition between the first level and the third level comprises detecting the first data bit and the third data bit have different bit values, and detecting the second data bit and the fourth data bit have different bit values.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that an output may include multiple parallel outputs, and that an input may include multiple parallel inputs.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element. For example, the first exclusive-OR gate 610 and the second exclusive-OR gate 620 may also be referred to as the second exclusive-OR gate and the first exclusive-OR gate, respectively.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:

a sampling circuit, wherein the sampling circuit is configured to:

receive a data signal including a first data symbol and a second data symbol, wherein each of the first data symbol and the second data symbol is at one of a first level, a second level, and a third level;

sample the first data symbol at a first sampling time to generate a first data bit and a second data bit;

sample the data signal at a second sampling time to generate an edge bit; and sample the second data symbol at a third sampling time to generate a third data bit and a fourth data bit;

a phase detector; and a transition filter coupled between the sampling circuit and the phase detector, wherein the transition filter is configured to:

receive the first data bit, the third data bit, and the edge bit;

detect a transition between the first level and the third level between the first data symbol and the second data symbol; and pass the first data bit, the third data bit, and the edge bit to the phase detector if the transition between the first level and the third level is detected.

2. The system of claim 1, wherein the transition filter is configured to block the first data bit, the third data bit, and the edge bit from the phase detector if the transition between the first level and the third level is not detected.

3. The system of claim 1, wherein the second level is between the first level and the third level.

4. The system of claim 1, wherein the transition filter is configured to:

receive the second data bit and the fourth data bit; and detect the transition between the first level and the third level if the first data bit and the third data bit have different bit values and the second data bit and the fourth data bit have different bit values.

5. The system of claim 4, wherein the transition filter is configured to block the first data bit, the third data bit, and the edge bit from the phase detector if the first data bit and the third data bit have a same bit value.

6. The system of claim 4, wherein the transition filter is configured to block the first data bit, the third data bit, and the edge bit from the phase detector if the second data bit and the fourth data bit have a same bit value.

7. The system of claim 1, wherein the data signal is modulated using pulse amplitude modulation 3-level (PAM3).

8. The system of claim 1, wherein the first sampling time and the third sampling time are separated by a unit interval (UI) of the data signal.

9. The system of claim 8, wherein the second sampling time is between the first sampling time and the third sampling time.

10. The system of claim 1, wherein the phase detector comprises a bang-bang phase detector.

11. The system of claim 10, wherein the bang-bang phase detector includes:

a first exclusive-OR gate having a first input, a second input, and an output, wherein the first input of the first exclusive-OR gate is configured to receive the first data bit, and the second input of the first exclusive-OR gate is configured to receive the edge bit; and a second exclusive-OR gate having a first input, a second input, and an output, wherein the first input of the second exclusive-OR gate is configured to receive the third data bit, and the second input of the second exclusive-OR gate is configured to receive the edge bit.

12. A system, comprising:

a sampling circuit, wherein the sampling circuit is configured to:

receive a data signal including a first data symbol and a second data symbol, wherein each of the first data symbol and the second data symbol is at one of a first level, a second level, and a third level;

sample the first data symbol at a first sampling time to generate a first data bit and a second data bit;

sample the data signal at a second sampling time to generate an edge bit; and sample the second data symbol at a third sampling time to generate a third data bit and a fourth data bit;

a phase detector; and a transition filter coupled between the sampling circuit and the phase detector, wherein the transition filter comprises:

a first gating circuit configured to receive the first data bit;

a second gating circuit configured to receive the third data bit;

a third gating circuit configured to receive the edge bit; and a transition detector configured to:

receive the first data bit, the second data bit, the third data bit, and the fourth data bit; and cause the first gating circuit, the second gating circuit, and the third gating circuit to pass the first data bit, the third data bit, and the edge bit, respectively, to the phase detector if the first data bit and the third data bit have different bit values and the second data bit and the fourth data bit have different bit values.

13. The system of claim 12, wherein the first gating circuit comprises a first AND gate, the second gating circuit comprises a second AND gate, and the third gating circuit comprises a third AND gate.

14. The system of claim 12, wherein the transition detector is configured to cause the first gating circuit, the second gating circuit, and the third gating circuit to block the first data bit, the third data bit, and the edge bit, respectively, from the phase detector if the first data bit and the third data bit have a same bit value.

15. The system of claim 12, wherein the transition detector is configured to cause the first gating circuit, the second gating circuit, and the third gating circuit to block the first data bit, the third data bit, and the edge bit, respectively, from the phase detector if the second data bit and the fourth data bit have a same bit value.

16. The system of claim 12, wherein the data signal is modulated using pulse amplitude modulation 3-level (PAM3).

17. The system of claim 12, wherein the phase detector comprises a bang-bang phase detector.

18. The system of claim 12, wherein the transition detector comprises:

a first exclusive-OR gate having a first input, a second input, and an output, wherein the first input of the first exclusive-OR gate is configured to receive the first data bit, and the second input of the first exclusive-OR gate is configured to receive the third data bit;

a second exclusive-OR gate having a first input, a second input, and an output, wherein the first input of the second exclusive-OR gate is configured to receive the second data bit, and the second input of the second exclusive-OR gate is configured to receive the fourth data bit; and an AND gate having a first input, a second input, and a third input, wherein the first input of the AND gate is coupled to the output of the first exclusive-OR gate, the second input of the AND gate is coupled to the output of the second exclusive-OR gate, and the output of the AND gate is coupled to the first gating circuit, the second gating circuit, and the third gating circuit.

19. A method for transition filtering, comprising:

receiving a data signal including a first data symbol and a second data symbol, wherein each of the first data symbol and the second data symbol is at one of a first level, a second level, and a third level;

sampling the first data symbol at a first sampling time to generate a first data bit and a second data bit;

sampling the data signal at a second sampling time to generate an edge bit;

sampling the second data symbol at a third sampling time to generate a third data bit and a fourth data bit;

detecting a transition between the first level and the third level between the first data symbol and the second data symbol; and passing the first data bit, the third data bit, and the edge bit to a phase detector in response to detecting the transition between the first level and the third level.

20. The method of claim 19, wherein detecting the transition between the first level and the third level comprises detecting the first data bit and the third data bit have different bit values, and detecting the second data bit and the fourth data bit have different bit values.

* * * * *